(12) United States Patent
Jia

(10) Patent No.: US 11,404,660 B2
(45) Date of Patent: Aug. 2, 2022

(54) FLEXIBLE ORGANIC LIGHT-EMITTING DISPLAY (OLED) AND SPRING COMPONENT

(71) Applicant: WUHAN CHINA STAR OPTOELECTRONICS SEMICONDUCTOR DISPLAY TECHNOLOGY CO., LTD., Wuhan (CN)

(72) Inventor: Yongzhen Jia, Wuhan (CN)

(*) Notice: Subject to any disclaimer, the term of this patent is extended or adjusted under 35 U.S.C. 154(b) by 724 days.

(21) Appl. No.: 16/349,621

(22) PCT Filed: Jan. 17, 2019

(86) PCT No.: PCT/CN2019/072169
§ 371 (c)(1),
(2) Date: May 14, 2019

(87) PCT Pub. No.: WO2020/118854
PCT Pub. Date: Jun. 18, 2020

(65) Prior Publication Data
US 2021/0184159 A1 Jun. 17, 2021

(30) Foreign Application Priority Data
Dec. 12, 2018 (CN) .......................... 201811520094.X

(51) Int. Cl.
*H01L 51/52* (2006.01)
*F03G 1/02* (2006.01)
(Continued)

(52) U.S. Cl.
CPC ............ *H01L 51/5237* (2013.01); *F03G 1/02* (2013.01); *F03G 1/08* (2013.01); *F03G 1/026* (2021.08); *F16F 1/06* (2013.01); *F16F 1/3665* (2013.01); *F16F 3/04* (2013.01); *F16F 3/0876* (2013.01); *F16F 2224/0208* (2013.01); *F16F 2224/0241* (2013.01); *F16F 2226/048* (2013.01); *F16F 2230/0005* (2013.01); *F16F 2232/02* (2013.01);
(Continued)

(58) Field of Classification Search
None
See application file for complete search history.

(56) References Cited

U.S. PATENT DOCUMENTS

2014/0002973 A1* 1/2014 Lee .................. H01L 51/5246
361/679.01
2014/0056028 A1* 2/2014 Nichol .................... F21K 9/65
362/616
(Continued)

FOREIGN PATENT DOCUMENTS

CN 203057227 U 7/2013
CN 108064402 A 5/2018
(Continued)

*Primary Examiner* — Michael Lebentritt

(57) ABSTRACT

Provided herein are a flexible organic light-emitting display (OLED) and a spring component. The film layers are pulled one on one by spring components to make the film layers flat when being unfolded and free of irreversible deformation when being folded. A lubricating layer is disposed between adjacent film layers so that the action force between the adjacent film layers is reduced, thereby making the flexible organic light-emitting display (OLED) flat and free of creases when being unfolded.

17 Claims, 3 Drawing Sheets

(51) Int. Cl.
*F03G 1/08* (2006.01)
*F16F 1/06* (2006.01)
*F16F 1/366* (2006.01)
*F16F 3/04* (2006.01)
*F16F 3/087* (2006.01)

(52) U.S. Cl.
CPC ....... *F16F 2234/02* (2013.01); *F16F 2236/08* (2013.01); *F16F 2238/026* (2013.01); *H01L 2251/5338* (2013.01)

(56) References Cited

U.S. PATENT DOCUMENTS

| | | | |
|---|---|---|---|
| 2014/0194165 A1* | 7/2014 | Hwang | ................. G06F 1/1652 |
| | | | 455/566 |
| 2015/0029229 A1 | 1/2015 | Voutsas | |
| 2018/0083222 A1* | 3/2018 | Wehlus | ............... H01L 27/3213 |
| 2018/0107250 A1 | 4/2018 | Cho | |
| 2020/0119110 A1* | 4/2020 | Chen | ........................ H01L 51/56 |
| 2020/0152096 A1* | 5/2020 | Jia | ............................ G09F 9/301 |
| 2020/0192495 A1* | 6/2020 | Lindblad | ............... H01L 51/52 |
| 2021/0005695 A1* | 1/2021 | Jia | ....................... H01L 27/1244 |
| 2021/0226158 A1* | 7/2021 | Jia | ....................... H01L 27/3244 |

FOREIGN PATENT DOCUMENTS

| | | |
|---|---|---|
| CN | 208014279 U | 10/2018 |
| CN | 108898957 A | 11/2018 |

\* cited by examiner

FLEXIBLE ORGANIC LIGHT-EMITTING DISPLAY (OLED) AND SPRING COMPONENT

FIELD OF APPLICATION

The present application generally relates to the display technology and, more particularly, to a flexible organic light-emitting display (OLED) and a spring component.

BACKGROUND OF APPLICATION

The foldable mobile phone is a research and development hotspot for the future flexible electronic products. Among them, the foldable organic light-emitting display (OLED) screen is the most critical component in a foldable mobile phone.

Currently, during the bending of a flexible OLED screen, the deformation between film layers may not be coordinated. The interaction between film layers increases the stress level of a film during the deformation due to bending. The complex hyperelastic, viscoelastic and plastic behaviors cooperatively cause the screen unable keep flat after it is folded. The resulting wavy display stripes lead to a major problem that must be overcome during the development of flexible screens.

SUMMARY OF APPLICATION

It is one object of the present application to provide a flexible organic light-emitting display (OLED), in which the action force between film layers is so small during the bending of a screen that the screen is capable of being flattened and free of creases when it is unfolded because irreversible deformation will not occur.

A further object of the present application is to provide a spring component. The spring stores or releases torsional elastic potential energy through the rotation of a cylinder.

A flexible organic light-emitting display (OLED) is provided. The flexible organic light-emitting display (OLED) includes a display panel, which includes:

at least two film layers, one end of one of the at least two film layers and one end of another adjacent one of the at least two film layers being fixed;

a lubricating layer disposed between the two adjacent film layers; and at least two spring components corresponding to the at least two film layers respectively;

the at least two spring components each including a cylinder, a first fixing portion, a spring, and a second fixing portion, the cylinder including a hollow cylindrical body and a first cylinder cap and a second cylinder cap disposed at two ends of the hollow cylindrical body, in the center of the first cylinder cap being provided a through hole, and in the center of the second cylinder cap being provided a circular groove;

the spring being disposed inside the hollow cylindrical body, and the spring including a first end portion and a second end portion, the first end portion passing through the through hole to be fixed on the first fixing portion, and the second end portion being disposed inside the hollow cylindrical body and being fixed on the second cylinder cap;

the second fixing portion including a circular end portion that cooperates with the circular groove, the circular end portion being inserted into the circular groove, and the other end of the second fixing portion being fixed; and the other end of the one of the at least two film layers and the other end of the another adjacent one of the at least two film layers being respectively fixed on the cylinders corresponding to the spring components.

In the flexible organic light-emitting display (OLED), the first end portion is welded onto the first fixing portion, or the first end portion is a ring and the first fixing portion is provided thereon with a hook portion passing through the ring to fix the first end portion.

In the flexible organic light-emitting display (OLED), the second end portion is welded onto the second cylinder cap, or the second end portion is a ring and the second cylinder cap is provided thereon with a hook portion passing through the ring to fix the second end portion.

In the flexible organic light-emitting display (OLED), the flexible organic light-emitting display (OLED) further includes an outer frame disposed around the display panel, the first fixing portion being fixed on the outer frame, the other end of the second fixing portion being fixed on the outer frame.

In the flexible organic light-emitting display (OLED), the display panel includes a supporting backplate layer, a light-emitting device layer, a polarizer layer, a touch-panel layer, and a cover layer disposed in order, and a plurality of spring components corresponding to the supporting backplate layer, the light-emitting device layer, the polarizer layer, the touch-panel layer, and the cover layer, respectively, one end of the supporting backplate layer, one end of the light-emitting device layer, one end of the polarizer layer, one end of the touch-panel layer, and one end of the cover layer being fixed, the other end of the supporting backplate layer, the other end of the light-emitting device layer, the other end of the polarizer layer, the other end of the touch-panel layer, and the other end of the cover layer being connected to the cylinders corresponding to the spring components, respectively.

In the flexible organic light-emitting display (OLED), the flexible organic light-emitting display (OLED) further includes an outer frame disposed around the display panel, one end of the supporting backplate layer, one end of the light-emitting device layer, one end of the polarizer layer, one end of the touch-panel layer, and one end of the cover layer being detachably and fixedly connected to the outer frame.

In the flexible organic light-emitting display (OLED), the allowable deformation coefficients of the springs of the spring components corresponding to the supporting backplate layer, the light-emitting device layer, the polarizer layer, the touch-panel layer, and the cover layer disposed in order decrease sequentially along the direction in which the cover layer is directed toward the supporting backplate layer.

In the flexible organic light-emitting display (OLED), the second fixing portion is an L-shaped fixing member including a circular end portion that cooperates with the circular groove, the other end of the L-shaped fixing member being fixed.

In the flexible organic light-emitting display (OLED), the spring components each apply a force greater than 0 N and less than 0.098 N per cm on each of the film layers.

In the flexible organic light-emitting display (OLED), the springs each are made of stainless steel or a carbon fiber composite material.

In the flexible organic light-emitting display (OLED), the lubricating layer is prepared using a lubricant.

In the flexible organic light-emitting display (OLED), the lubricant is at least one of polyalphaolefin (PAO), polyester synthetic or alkylbenzene (AKB), or the lubricant is a mineral oil.

A spring component is provided. The spring component includes a cylinder, a first fixing portion, a spring, and a second fixing portion, the cylinder including a hollow cylindrical body and a first cylinder cap and a second cylinder cap disposed at two ends of the hollow cylindrical body, in the center of the first cylinder cap being provided a through hole, and in the center of the second cylinder cap being provided a circular groove;

the spring being disposed inside the hollow cylindrical body, and the spring including a first end portion and a second end portion, the first end portion passing through the through hole to be fixed on the first fixing portion, and the second end portion being disposed inside the hollow cylindrical body and being fixed on the second cylinder cap; and the second fixing portion including a circular end portion that cooperates with the circular groove, the circular end portion being inserted into the circular groove, and the other end of the second fixing portion being fixed.

In the spring component, the first end portion is welded onto the first fixing portion, or the first end portion is a ring and the first fixing portion is provided thereon with a hook portion passing through the ring to fix the first end portion.

In the spring component, the second end portion is welded onto the second cylinder cap, or the second end portion is a ring and the second cylinder cap is provided thereon with a hook portion passing through the ring to fix the second end portion.

In the spring component, the second fixing portion is an L-shaped fixing member including a circular end portion that cooperates with the circular groove, the other end of the L-shaped fixing member being fixed.

In the spring component, the spring is made of stainless steel or a carbon fiber composite material.

The present application provides a flexible organic light-emitting display (OLED) and a spring component. The film layers are pulled one on one by spring components to make the film layers flat when being unfolded and free of irreversible deformation when being folded. A lubricating layer is disposed between adjacent film layers so that the action force between the adjacent film layers is reduced, thereby making the flexible organic light-emitting display (OLED) flat and free of creases when being unfolded.

DESCRIPTION OF DRAWINGS

In order to more clearly illustrate the embodiments or the technical solutions in the prior art, the drawings used in the embodiments or the prior art description will be briefly described below. Obviously, the drawings in the following description are only some implementations of the instant application. For example, other drawings may be obtained, without creative efforts, by those of ordinary skill in the art in light of the inventive work.

DETAILED DESCRIPTION OF PREFERRED EMBODIMENTS

With reference to the accompanying drawings, the technical solutions in the embodiments of the present application will be clearly and completely described in the following. It is apparent that the described embodiments are only a part, rather than all, of the embodiments of the present application. Based on the embodiments of the present application, any other embodiments obtained by a person skilled in the art without creative efforts still fall within the scope of the present application.

Figure 1:
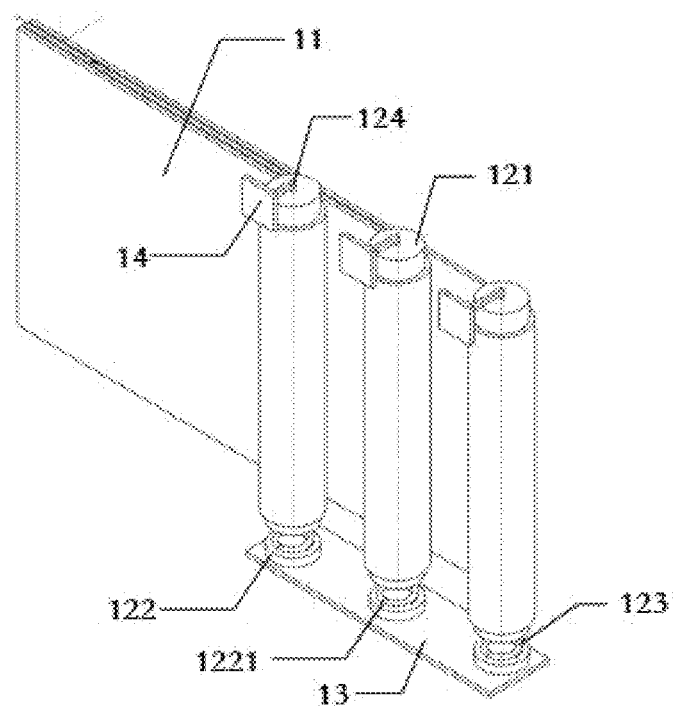
FIG. 1 is a perspective view of a flexible organic light-emitting display (OLED) in an unfolded state according to a first embodiment of the present application.
Figure 2:
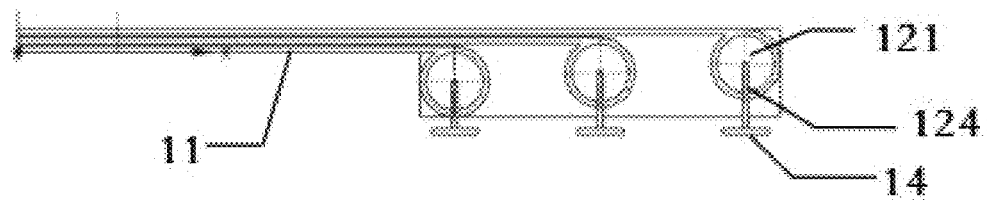
FIG. 2 is a top view of a flexible organic light-emitting display (OLED) in an unfolded state according to a first embodiment of the present application.
Figure 3:
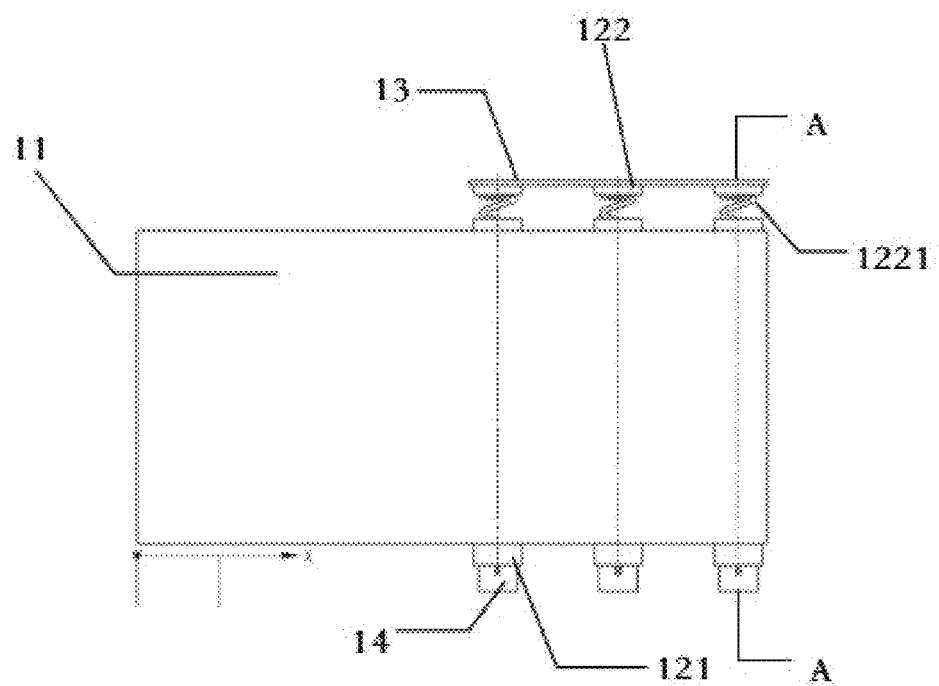
FIG. 3 is a front view of a flexible organic light-emitting display (OLED) in an unfolded state according to a first embodiment of the present application.

Please refer to FIG. 1, FIG. 2 and FIG. 3, which represent a perspective view, a top view, and a front view, respectively, of a flexible organic light-emitting display according to a first embodiment of the present application. The flexible organic light-emitting display includes a display panel, and the display panel includes:

at least two film layers 11, one end of one of the at least two film layers 11 and one end of another adjacent one of the at least two film layers 11 being fixed;

a lubricating layer (not shown) disposed between two adjacent film layers 11; and at least two spring components corresponding to the at least two film layers 11, respectively, the at least two spring components including a cylinder 121, a first fixing portion 122, a spring 123, and a second fixing portion 124, the cylinder 121 including a hollow cylindrical body and a first cylinder cap and a second cylinder cap disposed at two ends of the hollow cylindrical body, in the center of the first cylinder cap being provided a through hole, and in the center of the second cylinder cap being provided a circular groove;

the spring 123 being disposed inside the hollow cylindrical body, and the spring 123 including a first end portion and a second end portion, the first end portion passing through the through hole to be fixed on the first fixing portion 122, while the second end portion being disposed inside the hollow cylindrical body and being fixed on the second cylinder cap;

the second fixing portion 124 including a circular end portion that cooperates with the circular groove, the circular end portion being inserted into the circular groove, and the other end of the second fixing portion 124 being fixed; and the other end of the one of the at least two film layers 11 and the other end of the another adjacent one of the at least two film layers 11 being respectively fixed on the cylinder 121 corresponding to the spring components.

The display panel includes different film layers 11, such as a light-emitting device layer, a supporting backplate layer, and a protective cover layer. The substrates of the different film layers 11 are all flexible and foldable materials. For example, the substrate of the light-emitting device layer may be polyimide (PI), polyethylene terephthalate (PET), polycarbonate (PC), and polymethylmethacrylate (PMMA), etc. The substrates of the film layers 11 are all flexible and foldable materials such that the flexible organic light-emitting device has foldability.

One end of each adjacent film layer 11 constituting the display panel is fixed to prevent the flexible organic light-emitting display (OLED) from being unable to work normally due to a large degree of sliding between adjacent film layers 11 when the flexible organic light-emitting display is switched between the folded state and the unfolded state. The other end of each adjacent film layer 11 is respectively fixed on the corresponding cylinder 121 so that the cylinder 121 can control the shrinkage and stretching of each film layer 11 during unfolding and folding. In other words, when the film layers 11 are folded, the film layers 11 are provided to stretch the film layers 11, and when the film layers 11 are unfolded, the film layers 11 are pulled to shorten the film layers 11. The portions of the film layers 11 wound around the cylinder 121 are all non-display areas.

Figure 4:
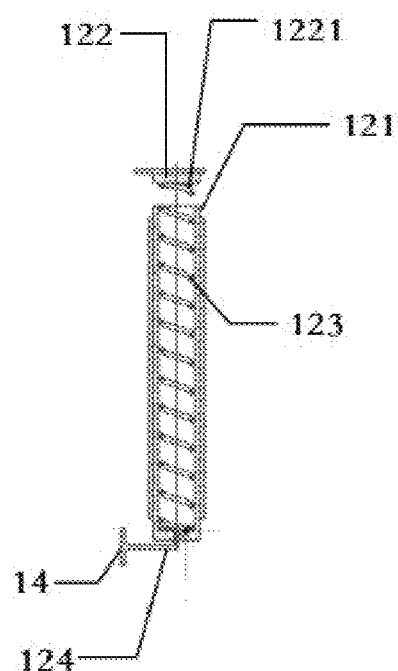
FIG. 4 is a cross-sectional view of the flexible organic light-emitting display (OLED) along A-A in FIG. 3.

As shown in FIG. 4, which is a cross-sectional view of the flexible organic light-emitting display (OLED) along A-A in FIG. 3. In the spring components, the second fixing portion 124 is inserted into the cylinder 121 so that the cylinder 121 can rotate about the central axis thereof. The spring 123 provided inside the cylinder 121 is fixed on the second cylinder cap at one end and fixed on the first fixing portion 122 at the other end. A force is applied to the cylinder 121 to rotate the cylinder 121 about the central axis thereof. One end of the spring 123 fixedly connected to the cylinder 121 drives the spring 123 to rotate so that elastic potential energy is accumulated in the spring 123. After the force applied to the cylinder 121 is removed, the spring 123 releases the accumulated elastic potential energy to drive the cylinder 121 to rotate. When the flexible organic light-emitting display is folded, the film layers 11 on the cylinder 121 are stretched by a pulling force to prevent creases at the bend due to irreversible deformation of the film layers 11. At the same time, the cylinder 121 is driven by the pulling force to rotate so that the elastic potential energy is accumulated in the spring 123. When the flexible organic light-emitting display is unfolded, the spring 123 releases the accumulated elastic potential energy to rotate the cylinder 121 to wind up the film layers which is stretched when the flexible organic light-emitting display is folded, so that the flexible organic light-emitting display is flatly unfolded.

A lubricating layer is disposed between adjacent film layers 11 constituting the display panel to provide lubrication. When the flexible organic light-emitting display is switched between the folded state and the unfolded state, the lubricating layer can reduce the friction between the adjacent film layers 11 to thereby reduce the action force between the adjacent film layers 11 to prevent creases on each film layer.

In the flexible organic light-emitting display, the film layers are pulled one on one by spring components to make the film layers flat when being unfolded and free of irreversible deformation when being folded. A lubricating layer is disposed between adjacent film layers so that the action force between the adjacent film layers is reduced, thereby making the flexible organic light-emitting display flat and free of creases when being unfolded.

In the present embodiment, the spring 123 is a spiral spring. The spring 123 may be a single spring, or may be a plurality of springs connected in series, a plurality of springs connected in parallel or a plurality of springs connected both in series and in parallel. The parameters such as the radius, the number of turns, and the height of a single spring can be selected according to actual needs, to which the present application is not limited. It should be understood that, in the present application, the spring 123 stores and releases the elastic potential energy by torsion. Therefore, it is necessary to select a suitable material to prepare the spring 123 so that the spring 123 can be stably twisted multiple times. More particularly, the spring 123 is prepared by stainless steel or a carbon fiber composite material.

The first end portion is welded onto the first fixing portion 122, or the first end portion is a ring and the first fixing portion 122 is provided thereon with a hook portion passing through the ring to fix the first end portion, or the first end portion is a hook portion and the first fixing portion 122 is provided with a through hole that cooperates with the hook portion passing through the through hole to fix the first end portion, or the first end portion is provided thereon with an external thread and the first fixing portion 122 is provided thereon with a threaded hole that cooperates with the external thread on the first end portion so that the first end portion can be screwed into the threaded hole. The first end portion can also be fixed on the first fixing portion 122 by other methods as long as the first end portion is ensured to be fixed when the spring 123 is being twisted. In the present embodiment, as shown in FIG. 3 and FIG. 4, the first end portion is connected to the first fixing portion 122 through a spring fixing portion 1221 disposed on the first fixing portion 122. The spring fixing portion 1221 may be a spring. The spring fixing portion 1221 and the spring 123 may be integrally formed or may be connected by welding.

The second end portion is welded onto the second cylinder cap, or the second end portion is a ring and the second cylinder cap is provided thereon with a hook portion passing through the ring to fix the second end portion, or the second end portion is a hook portion and the second cylinder cap is provided with a through hole that cooperates with the hook portion passing through the through hole to fix the second end portion, or the second end portion is provided thereon with an external thread and the second cylinder cap is provided thereon with a threaded hole that cooperates with the external thread on the second end portion. The second end portion can also be fixed on the second cylinder cap by other methods. When the second end portion is fixed on the second cylinder cap, the rotation of the cylinder 121 can drive the spring 123 to twist to store the elastic potential energy. The spring 123 can be twisted to release the elastic potential energy to drive the cylinder 121 to rotate. The second end portion is fixed at the center position of the second cylinder cap, which facilitates respective portions of the spring 123 to store and release elastic potential energy more uniformly.

The first fixing portion 122 is configured to fix the spring 123 and is made of a hard material. The first fixing portion 122 has a plate shape, and may be in the shape of a cylinder, a rectangular parallelepiped or the like. The springs 123 corresponding to different film layers 11 may be fixed on the same first fixing portion 122 or may also be fixed on different first fixing portions 122. In the present embodiment, the springs 123 corresponding to different film layers 11 are fixed on different first fixing portions 122.

The second fixing portion 124 is configured to support and fix the cylinder 121. There is a second fixing portion 124 corresponding to each cylinder 121. The second fixing portion 124 is an L-shaped fixing member including a circular end portion that cooperates with the circular groove. The other end of the L-shaped fixing member is fixed. The circular end portion enables the cylinder 121 to rotate about the central axis thereof.

Furthermore, the flexible organic light-emitting display further includes an outer frame (not shown) disposed around the display panel. The first fixing portion 122 is fixed on the outer frame, and the other end of the second fixing portion 124 is fixed on the outer frame. The outer frame is a middle frame of the flexible organic light-emitting display, which constitutes a skeleton of the flexible organic light-emitting display. The preparation material is a hard material for supporting and protection. When the display panel has four sides, the outer frame is circumferentially disposed around the display panel with the first fixing portion 122 and the second fixing portion 124 being respectively fixed on opposite outer frames. As shown in FIG. 1 and FIG. 3, the first fixing portions 122 corresponding to respective film layers 11 are connected to the outer frame through the same first fixing plate 13, and the second fixing portions 124 corresponding to respective film layers 11 are connected to the outer frame, respectively, through independent second fixing plates 14. In other embodiments, the first fixing portion 122 can be fixed on the outer frame by bonding or welding, and the second fixing portion 124 can also be fixed on the outer frame by bonding or welding.

In the present embodiment, one end of one of the film layers and one end of another adjacent film layer are fixed on the outer frame.

In the present embodiment, the lubricating layer is prepared using a lubricant. The lubricant is an optical grade lubricant, which is uniformly disposed between two adjacent film layers 11 by coating or spraying to provide lubrication. The thickness of the lubricant is thin and is negligible, as compared to that of the film layers 11. The lubricant is at least one of polyalphaolefin (PAO), polyester synthetic or alkylbenzene (AKB), or the lubricant is a mineral oil.

In the present application, it is also found that the tensile force on each film layer is greater than 0 N and less than 0.098 N per unit length (cm). In other words, when the spring releases or stores elastic potential energy, the tensile force on each film layer is greater than 0 N and less than 0.098 N per unit length (cm). Optionally, the tensile force on each film layer is greater than 0.04 N and less than 0.08 N per unit length (cm).

Figure 5:
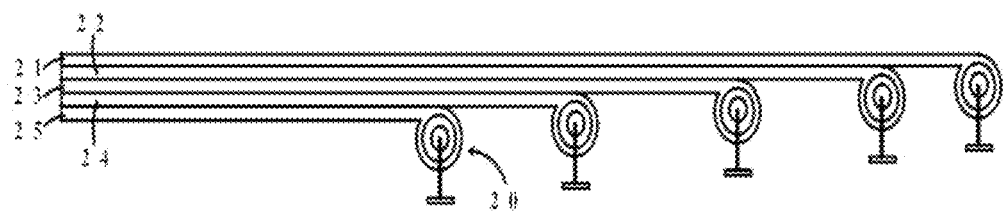
FIG. 5 a top view of a flexible organic light-emitting display (OLED) in an unfolded state according to a second embodiment of the present application.

FIG. 5 a top view of a flexible organic light-emitting display (OLED) in an unfolded state according to a second embodiment of the present application. The flexible organic light-emitting display includes a supporting backplate layer 21, a light-emitting device layer 22, a polarizer layer 23, a touch-panel layer 24, and a cover layer 25 disposed in order, and a spring component 20 corresponding to the supporting backplate layer 21, the light-emitting device layer 22, the polarizer layer 23, the touch-panel layer 24, and the cover layer 25, respectively. One end of the supporting backplate layer 21, one end of the light-emitting device layer 22, one end of the polarizer layer 23, one end of the touch-panel layer 24, and one end of the cover layer 25 are fixed, and the other end of the supporting backplate layer 21, the other end of the light-emitting device layer 22, the other end of the polarizer layer 23, the other end of the touch-panel layer 24, and the other end of the cover layer 25 are connected to the cylinder corresponding to the spring components 20, respectively. A lubricating layer (not shown) is disposed between adjacent film layers.

It should be noted that the other end of the supporting backplate layer 21, the other end of the light-emitting device layer 22, the other end of the polarizer layer 23, the other end of the touch-panel layer 24, and the other end of the cover layer 25 are connected to the cylinder corresponding to the spring components 20, respectively. The other end of the supporting backplate layer 21, the other end of the light-emitting device layer 22, the other end of the polarizer layer 23, the other end of the touch-panel layer 24, and the other end of the cover layer 25 are disposed on a non-display area of the flexible organic light-emitting display.

During the switching between the folded state and the unfolded state of the flexible organic light-emitting display, the supporting backplate layer 21, the light-emitting device layer 22, the polarizer layer 23, the touch-panel layer 24, and the cover layer 25 are folded and unfolded. Since the compositions and thicknesses of the film layers are different and the degree of bending of each film layer is different when being folded, it is necessary to comprehensively consider the composition and the degree of bending of each film layer to correspondingly select appropriate springs and coordinately control the stretching and shrinkage of each film layer in the folded state and in the unfolded state.

For the externally folded flexible organic light-emitting display, the direction of bending of the flexible organic light-emitting display is directed from the cover layer 25 to the supporting backplate layer 21. The allowable deformation coefficient of the spring of the spring component 20 corresponding to the supporting backplate layer 21, the light-emitting device layer 22, the polarizer layer 23, the touch-panel layer 24, and the cover 25 layer disposed in order decreases sequentially along the direction in which the cover layer 25 is directed toward the supporting backplate layer 21. In other words, the allowable deformation coefficient of the spring corresponding to the supporting backplate layer 21 is the smallest, and the allowable deformation coefficient of the spring corresponding to the cover layer 25 is the largest.

Furthermore, the flexible organic light-emitting display further includes an outer frame disposed around the display panel. One end of the supporting backplate layer 21, one end of the light-emitting device layer 22, one end of the polarizer layer 23, one end of the touch-panel layer 24, and one end of the cover layer 25 are detachably and fixedly connected to the outer frame. Detachable and fixed connections include, but are not limited to, bolted connections.

The descriptions of the above embodiments are only for helping to understand the technical solutions and the core ideas of the present application. Those of ordinary skill in the art should understand that they can modify the technical solutions, or equivalently substitute some of the technical features described in the foregoing embodiments. Such modifications or substitutions do not depart from the essence of the technical solutions of the embodiments of the present application.

What is claimed is:

1. A flexible organic light-emitting display (OLED), wherein the flexible organic light-emitting display comprises a display panel, the display panel comprising:
   at least two film layers, one end of one of the at least two film layers and one end of another adjacent one of the at least two film layers being fixed;
   a lubricating layer disposed between two adjacent film layers; and
   at least two spring components corresponding to the at least two film layers respectively, the at least two spring components comprising a cylinder, a first fixing portion, a spring and a second fixing portion,
   the cylinder comprising a hollow cylindrical body and a first cylinder cap and a second cylinder cap disposed at two ends of the hollow cylindrical body, in the center of the first cylinder cap being provided a through hole, and in the center of the second cylinder cap being provided a circular groove;
   the spring being disposed inside the hollow cylindrical body, and the spring comprising a first end portion and a second end portion, the first end portion passing through the through hole to be fixed on the first fixing portion, while the second end portion being disposed inside the hollow cylindrical body and being fixed on the second cylinder cap;

the second fixing portion comprising a circular end portion that cooperates with the circular groove, the circular end portion being inserted into the circular groove, and the other end of the second fixing portion being fixed; and the other end of the one of the at least two film layers and the other end of the another adjacent one of the at least two film layers being respectively fixed on the cylinder corresponding to the spring components.

2. The flexible organic light-emitting display (OLED) of claim 1, wherein the first end portion is welded onto the first fixing portion, or the first end portion is a ring and the first fixing portion is provided thereon with a hook portion passing through the ring to fix the first end portion.

3. The flexible organic light-emitting display (OLED) of claim 1, wherein the second end portion is welded onto the second cylinder cap, or the second end portion is a ring and the second cylinder cap is provided thereon with a hook portion passing through the ring to fix the second end portion.

4. The flexible organic light-emitting display (OLED) of claim 1, wherein the flexible organic light-emitting display (OLED) further comprises an outer frame disposed around the display panel, the first fixing portion being fixed on the outer frame, the other end of the second fixing portion being fixed on the outer frame.

5. The flexible organic light-emitting display (OLED) of claim 1, wherein the display panel comprises a supporting backplate layer, a light-emitting device layer, a polarizer layer, a touch-panel layer, and a cover layer disposed in order, and a spring component corresponding to the supporting backplate layer, the light-emitting device layer, the polarizer layer, the touch-panel layer, and the cover layer, respectively, one end of the supporting backplate layer, one end of the light-emitting device layer, one end of the polarizer layer, one end of the touch-panel layer, and one end of the cover layer being fixed, the other end of the supporting backplate layer, the other end of the light-emitting device layer, the other end of the polarizer layer, the other end of the touch-panel layer, and the other end of the cover layer being connected to the cylinder corresponding to the spring components, respectively.

6. The flexible organic light-emitting display (OLED) of claim 5, wherein the flexible organic light-emitting display (OLED) further comprises an outer frame disposed around the display panel, one end of the supporting backplate layer, one end of the light-emitting device layer, one end of the polarizer layer, one end of the touch-panel layer, and one end of the cover layer being detachably and fixedly connected to the outer frame.

7. The flexible organic light-emitting display (OLED) of claim 5, wherein the allowable deformation coefficient of the spring of the spring component corresponding to the supporting backplate layer, the light-emitting device layer, the polarizer layer, the touch-panel layer, and the cover layer disposed in order decreases sequentially along the direction in which the cover layer is directed toward the supporting backplate layer.

8. The flexible organic light-emitting display (OLED) of claim 1, wherein the second fixing portion is an L-shaped fixing member comprising a circular end portion that cooperates with the circular groove, the other end of the L-shaped fixing member being fixed.

9. The flexible organic light-emitting display (OLED) of claim 1, wherein the lubricating layer is prepared using a lubricant.

10. The flexible organic light-emitting display (OLED) of claim 9, wherein the lubricant is at least one of polyalphaolefin (PAO), polyester synthetic or alkylbenzene (AKB), or the lubricant is a mineral oil.

11. The flexible organic light-emitting display (OLED) of claim 1, wherein the spring component applies a force greater than 0 N and less than 0.098 N per cm on the film layers.

12. The flexible organic light-emitting display (OLED) of claim 1, wherein the spring is made of stainless steel or a carbon fiber composite material.

13. A spring component, wherein the spring component comprises a cylinder, a first fixing portion, a spring, and a second fixing portion, the cylinder comprising a hollow cylindrical body and a first cylinder cap and a second cylinder cap disposed at two ends of the hollow cylindrical body, in the center of the first cylinder cap being provided a through hole, and in the center of the second cylinder cap being provided a circular groove;

the spring being disposed inside the hollow cylindrical body, and the spring comprising a first end portion and a second end portion, the first end portion passing through the through hole to be fixed on the first fixing portion, while the second end portion being disposed inside the hollow cylindrical body and being fixed on the second cylinder cap; and the second fixing portion comprising a circular end portion that cooperates with the circular groove, the circular end portion being inserted into the circular groove, and the other end of the second fixing portion being fixed.

14. The spring component of claim 13, wherein the first end portion is welded onto the first fixing portion, or the first end portion is a ring and the first fixing portion is provided thereon with a hook portion passing through the ring to fix the first end portion.

15. The spring component of claim 13, wherein the second end portion is welded onto the second cylinder cap, or the second end portion is a ring and the second cylinder cap is provided thereon with a hook portion passing through the ring to fix the second end portion.

16. The spring component of claim 13, wherein the second fixing portion is an L-shaped fixing member comprising a circular end portion that cooperates with the circular groove, the other end of the L-shaped fixing member being fixed.

17. The spring component of claim 13, wherein the spring is made of stainless steel or a carbon fiber composite material.

* * * * *